United States Patent
Chang et al.

(10) Patent No.: US 7,612,578 B2
(45) Date of Patent: Nov. 3, 2009

(54) SEMICONDUCTOR DEVICE, TEST SYSTEM AND METHOD OF TESTING ON DIE TERMINATION CIRCUIT

(75) Inventors: Young-Uk Chang, Suwon-si (KR); Dong-Ho Hyun, Suwon-si (KR); Seok-Won Hwang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/585,615

(22) Filed: Oct. 24, 2006

(65) Prior Publication Data

US 2007/0103189 A1 May 10, 2007

(30) Foreign Application Priority Data

Nov. 3, 2005 (KR) .................. 10-2005-0104827

(51) Int. Cl.
*H03K 17/16* (2006.01)
*H03K 19/003* (2006.01)
*G06F 13/00* (2006.01)

(52) U.S. Cl. ................. 326/30; 326/21; 710/32
(58) Field of Classification Search ............ 326/30
See application file for complete search history.

(56) References Cited

U.S. PATENT DOCUMENTS 5,502,400 A 3/1996 Livolsi et al.
7,038,485 B2 5/2006 Nakashima et al.
7,323,900 B2 * 1/2008 Kim ......................... 326/30
2003/0218477 A1 * 11/2003 Jang et al. ................ 326/30
2004/0150421 A1 * 8/2004 Nakashima et al. ........ 326/30
2005/0088150 A1 4/2005 Hamanaka ................. 323/208

FOREIGN PATENT DOCUMENTS

| JP | 08-162930 | 6/1996 |
| JP | 2004-215128 | 7/2004 |
| KR | 10-0410552 | 12/2003 |
| KR | 2003-0096064 | 12/2003 |

* cited by examiner

*Primary Examiner*—Vibol Tan
*Assistant Examiner*—Matthew C Tabler
(74) *Attorney, Agent, or Firm*—Mills & Onello, LLP

(57) ABSTRACT

A semiconductor device, a test system and a method of testing an on die termination (ODT) circuit are disclosed. The semiconductor device includes an ODT circuit, a termination impedance control circuit and a boundary scan circuit. The termination impedance control circuit generates termination impedance control signals in response to a test mode command. The ODT circuit is coupled to the plurality of input/output pads and generates a plurality of termination impedances in response to the impedance control signals. The boundary scan circuit stores the termination impedances to output the stored termination impedances. Thus, the semiconductor device may test an ODT circuit accurately by using a smaller number of pins and may reduce a required time for testing the semiconductor device.

18 Claims, 9 Drawing Sheets

SEMICONDUCTOR DEVICE, TEST SYSTEM AND METHOD OF TESTING ON DIE TERMINATION CIRCUIT

CROSS-REFERENCE TO RELATED APPLICATION

This application claims priority under 35 USC § 119 to Korean Patent Application No. 10-2005-0104827, filed on Nov. 3, 2005, in the Korean Intellectual Property Office, the contents of which are herein incorporated by reference in their entirety.

BACKGROUND OF THE INVENTION

1. Field of the Invention

The present invention relates to a semiconductor device, a test system and a method of testing on die termination (ODT) circuit.

2. Description of the Related Art

Recently, swing margin of transmitted signals between semiconductor devices has been gradually reduced in order to increase transmission speed of a signal. As the swing margin is reduced, the semiconductor devices are more affected by external noise and the signal reflection increases. The signal reflection is caused by impedance mismatching between the semiconductor devices.

When impedance mismatching between the semiconductor devices occurs, it becomes difficult to transmit signals at a high speed and there is a greater chance to have a transmission error due to distortion of data outputted from the semiconductor devices.

Therefore, a termination circuit is included in electronic devices for impedance matching between the semiconductor devices. The termination circuit may also reduce reflected waves that are generated during signal transmission.

For the purposes described above, semiconductor devices, and more particularly, semiconductor memory devices, that include on die termination (ODT) circuits coupled to pads have been developed.

FIG. 1 is a circuit diagram illustrating a conventional ODT circuit included in semiconductor devices. The conventional ODT circuit shown in FIG. 1 is disclosed in Korean Patent Laid-Open Publication No. 2003-0096064.

Referring to FIG. 1, the ODT circuit includes a positive channel metal oxide semiconductor (PMOS) transistor MP1, a negative channel metal oxide semiconductor (NMOS) transistor MN1, an inverter 2, resistors R1 and R2, and a pad 4. The resistors R1, R2 are termination resistors for impedance matching. When an ODT control signal ODT_EN is logic 'low', the PMOS transistor MP1 and the NMOS transistor MN1 are both off and thus the ODT is not enabled. When the ODT control signal ODT_EN is logic 'high', both of the PMOS transistor MP1 and the NMOS transistor MN1 are turned on and a signal applied to the pad 4 is terminated with a voltage divided by resistors R1 and R2.

A termination voltage has a voltage level between power supply voltage VDDQ and ground voltage. When the resistor R1 and the resistor R2 have the same resistance and the transistors MP1 and MP2 have on-resistance identical to each other, the termination voltage corresponds to ½ power supply voltage VDDQ. That is, the ODT circuit in FIG. 1 may provide a desired termination resistance with the two resistors R1 and R2.

The PMOS transistor MP1 and the NMOS transistor MN1 typically have a large size so as to reduce on-resistance. The ODT control signal ODT_EN of logic 'high' is applied so that the signal is terminated with a predetermined level of voltage. On the contrary, when there is no need to terminate a signal applied through the pad 4, the ODT control signal ODT_EN of logic 'low' is applied so as to disable the ODT circuit.

For impedance matching between semiconductor devices, an ODT circuit is included in semiconductor devices. The ODT circuit needs to be tested in advance to confirm whether the ODT circuit functions correctly. However, the ODT circuit includes tens or more of pins. It is not an easy task to examine each of the pins coupled to the ODT circuit. Furthermore, when hundreds of semiconductor memory devices are tested at the same time, the number of pins that are simultaneously examined is considerable, thereby decreasing accuracy of the test.

Therefore, for an accurate test result, it is desirable to reduce the number of pins that are used for an ODT test.

SUMMARY OF THE INVENTION

Accordingly, the present invention is provided to substantially obviate one or more problems due to limitations and disadvantages of the related art.

Example embodiments of the present invention provide a semiconductor device capable of testing an on die termination (ODT) circuit accurately using a smaller number of pins.

Example embodiments of the present invention also provide an ODT test system capable of testing an ODT circuit accurately using a smaller number of pins.

Example embodiments of the present invention also provide a method of testing an ODT circuit accurately using a smaller number of pins.

According to one aspect, the present invention is directed to a semiconductor device that includes a termination impedance control circuit, an on die termination (ODT) circuit and a boundary scan circuit. The termination impedance control circuit generates a termination impedance control signal in response to a test mode command. The ODT circuit is coupled to a plurality of pads and generates a plurality of termination impedances. The boundary scan circuit stores the termination impedances to sequentially output the stored termination impedances.

The termination impedances may be outputted through one pin. The termination impedance control signal may include a first termination impedance control signal that controls a P channel transistor array and a second termination impedance control signal that controls an N channel transistor array.

In some embodiments, the ODT circuit may include a plurality of termination circuits respectively coupled to the pads and generating the plurality of termination impedances. Each of the termination circuits may include at least one termination circuit branch that provides an impedance to a first node coupled to a corresponding pad in response to the first and second termination impedance control signals. The termination circuit branch may include a PMOS transistor and a first resistor that are coupled in series between a first power supply voltage and the first node, and an NMOS transistor and a second resistor, which are coupled in series between the first node and a second power supply voltage.

In some embodiments, the termination impedance control circuit may include a mode register set (MRS) circuit, which generates a MRS signal in response to the test command, a self-control unit, which generates first and second self-variable control signals for controlling self termination, and a multiplexer, which multiplexes the first and second self-variable control signals to output the termination impedance control signals in response to the MRS signal.

The self-control unit may be coupled to an external resistor outside a semiconductor device. The termination impedance control signal may include a first termination impedance control signal that controls a P channel transistor array.

The ODT circuit may include a plurality of termination circuits respectively coupled to the pads and which generates the plurality of termination impedances. Each of the termination circuits may include at least one termination circuit branch, which provides a predetermined impedance to a first node, which is coupled to a corresponding pad, in response to the first and the second termination impedance control signals. The termination circuit branch may include a PMOS transistor and a resistor that are coupled in series between a first power supply voltage and the first node.

In one embodiment, the termination impedance control circuit includes a mode register set (MRS) circuit configured to generate a MRS signal in response to the test command, a self-control unit configured to generate a first self-variable control signal for controlling self termination, and a multiplexer configured to multiplex the first self-variable control signal to output the termination impedance control signals in response to the MRS signal. The self-control unit may be coupled to an external resistor outside the semiconductor device.

The boundary scan circuit may include boundary scan registers cascaded with each other. The boundary scan registers may store the termination impedances respectively to sequentially output the termination impedances by a shifting operation.

According to another aspect, the present invention is directed to a test system that includes a termination impedance control circuit, an on die termination (ODT) circuit, a semiconductor memory device and a test device. The termination impedance control circuit generates a termination impedance control signal in response to a test mode command. The on die termination (ODT) circuit is coupled to a plurality of pads and generates a plurality of termination impedances in response to the termination impedance control signal. The semiconductor memory device includes a boundary scan circuit, which stores the termination impedances to sequentially output the stored termination impedances. The test device generates the test mode command applied to the semiconductor memory device and measures the termination impedances.

In one embodiment, the termination impedances are outputted through one pin.

In one embodiment, the termination impedance control signal includes a first termination impedance control signal that controls a P channel transistor array and a second termination impedance control signal that controls an N channel transistor array.

In one embodiment, the termination impedance control signal includes a first termination impedance control signal that controls a P channel transistor array.

In one embodiment, the boundary scan circuit includes boundary scan registers cascade-connected with each other. The boundary scan registers can respectively store the termination impedances to sequentially output the termination impedances by a shifting operation.

According to another aspect, the present invention is directed to a method of testing on die termination (ODT) circuit. According to the method, a test mode command is generated, and a termination impedance control signal is generated in response to the test mode command. A plurality of termination impedances is generated in response to the termination impedance control signal. The termination impedances are stored to output the stored termination impedances using a boundary scan circuit. The termination impedances is measured.

In the method of testing ODT circuit, a first terminal of a resistor may be set to logic 'low', in which the resistor is coupled to a pad of a semiconductor device under test.

According to the invention, an ODT circuit may be tested accurately using a smaller number of pins. The time required for testing the semiconductor devices may be reduced.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

DESCRIPTION OF THE EMBODIMENTS

Embodiments of the present invention now will be described more fully with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
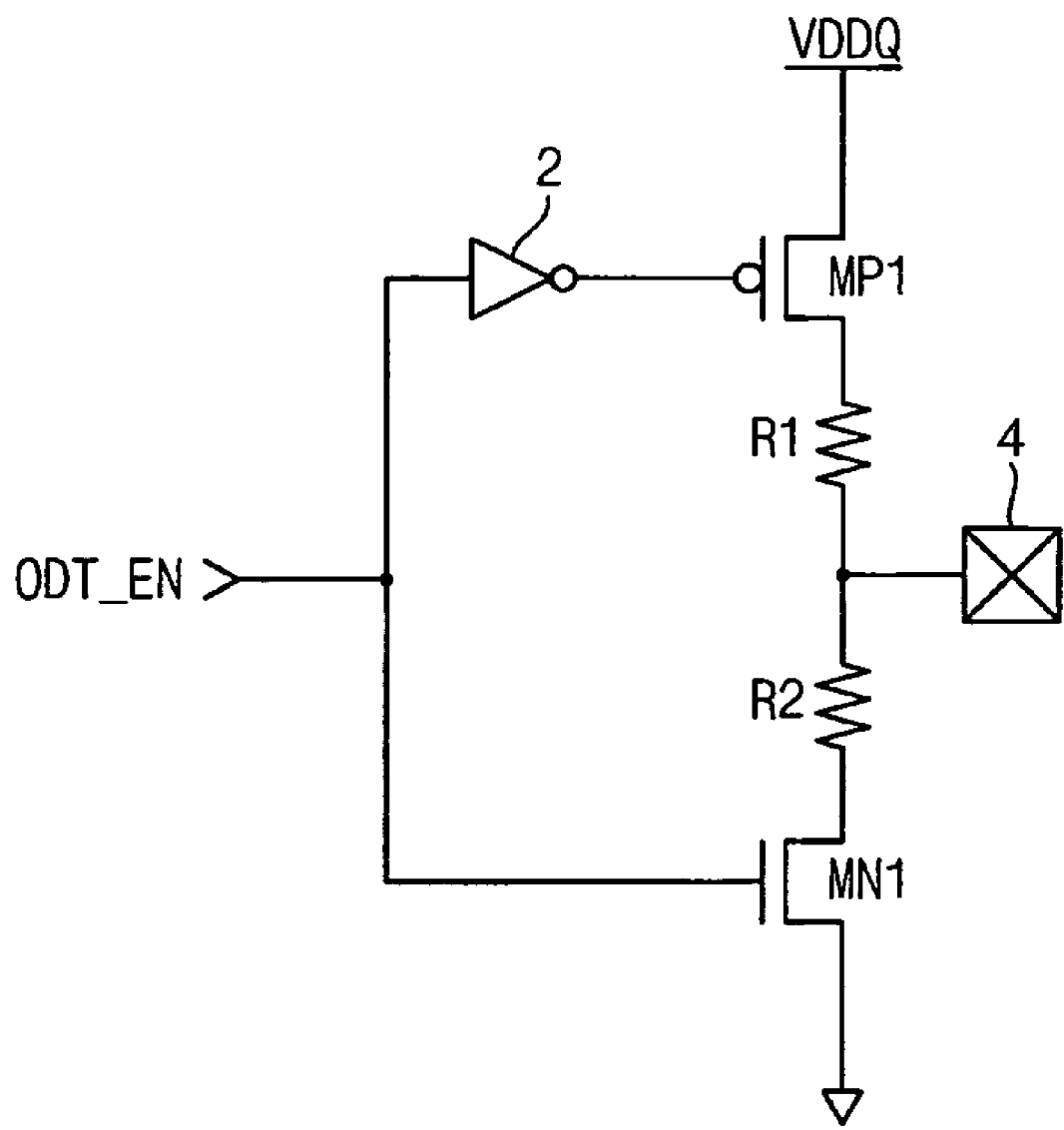
FIG. 1 is a circuit diagram illustrating a conventional on die termination (ODT) circuit included in semiconductor devices.
Figure 2:
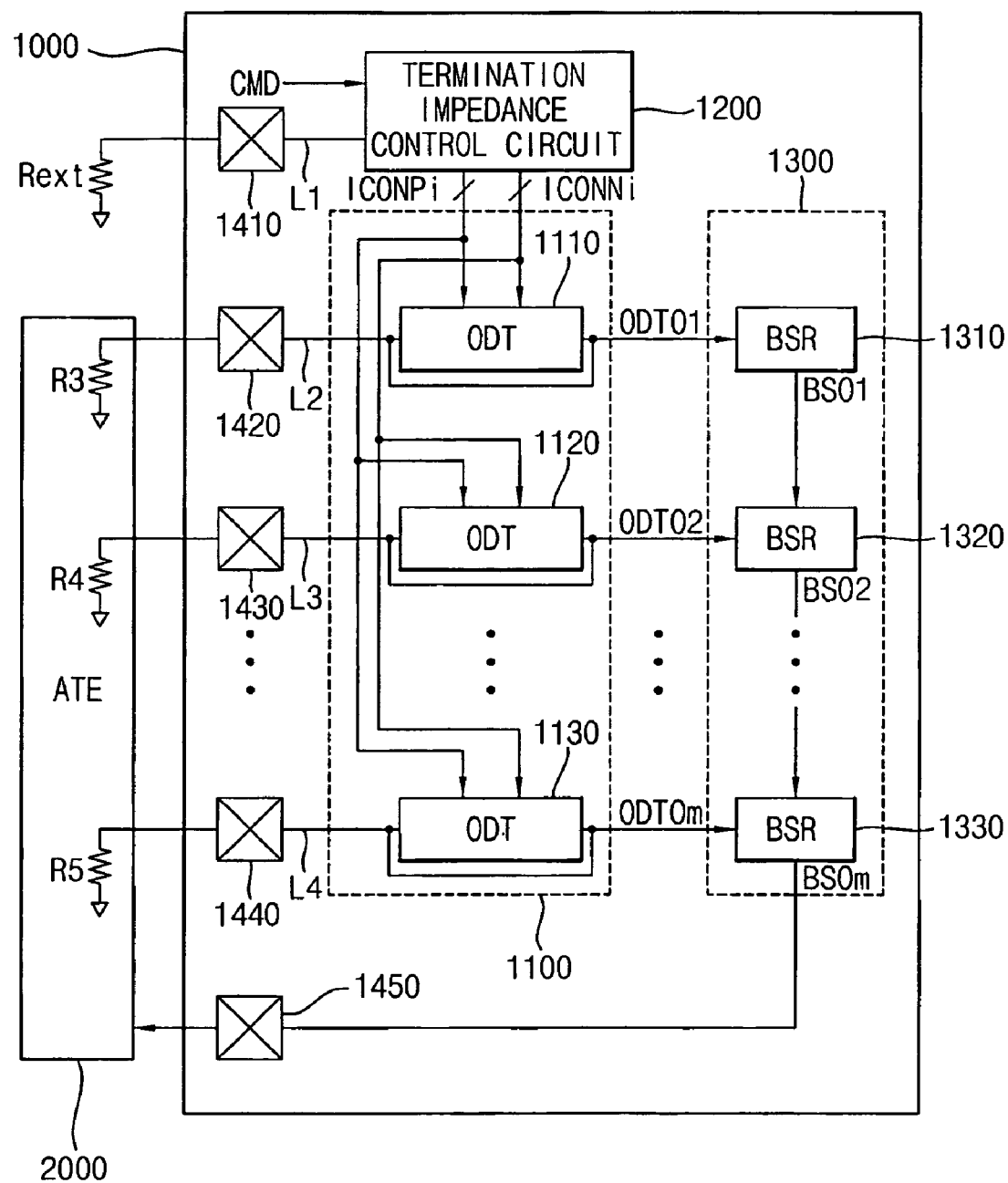
FIG. 2 is a block diagram illustrating an ODT test system including an ODT circuit and a boundary scan circuit according to an example embodiment of the present invention.

FIG. 2 is a block diagram illustrating an on die termination (ODT) test system including a semiconductor device according to an example embodiment of the present invention.

Referring to FIG. 2, the ODT test system includes a semiconductor device 1000 and a test device 2000. The semiconductor device (e.g., a semiconductor memory device) 1000 includes an ODT circuit 1100, a termination impedance control circuit 1200, a boundary scan circuit 1300 and pads 1410, 1420, 1430, 1440 and 1450. The test device 2000 includes resistors R3, R4 and R5 coupled to the pads 1420, 1430 and 1440. The ODT circuit 1100 includes termination circuits 1110, 1120 and 1130 coupled to the pads 1420, 1430 and 1440. The boundary scan circuit 1300 includes boundary scan registers 1310, 1320 and 1330.

The termination impedance control circuit 1200 may be coupled to an external resistor Rext through the pad 1410. The pads 1410, 1420, 1430, 1440 and 1450 are coupled to Input/Output pins (not shown).

The termination impedance control circuit 1200 generates termination impedance control signals ICONPi and ICONNi in response to a test mode command CMD. The ODT circuit 1200 is coupled to the plurality of input/output pads 1420, 1430 and 1440. The ODT circuit 1200 generates a plurality of termination impedances ODT01 through ODT0m in response to the impedance control signals ICONPi and ICONNi. The boundary scan circuit 1300 stores the termination impedances ODT01 through ODT0m to output the stored termination impedances ODT01 to ODT0m sequentially when the test mode command CMD is enabled. In general, the semiconductor device includes the boundary scan circuit 1300 coupled to the pads in the semiconductor device so as to test whether contacts of the pins are defective.

The test devices 2000 generates the test mode command CMD, which is provided to the semiconductor memory device 1000, and measures the termination impedances ODT01 to ODT0m.

Figure 3:
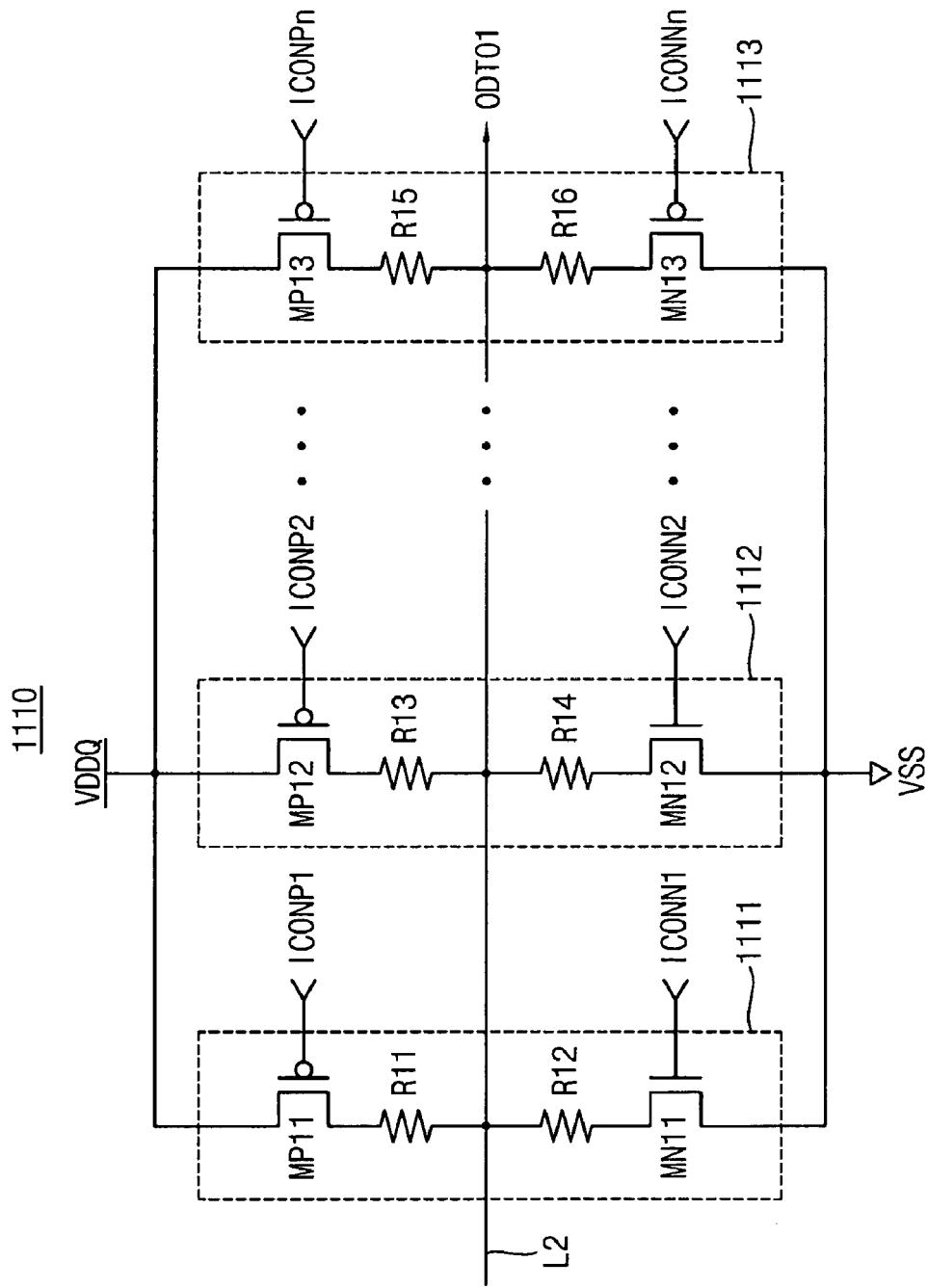
FIG. 3 is a circuit diagram illustrating an example embodiment of the ODT circuit included in the semiconductor memory device in FIG. 2.

FIG. 3 is a circuit diagram illustrating an example embodiment of the ODT circuit included in the semiconductor memory device in FIG. 2.

Referring to FIG. 3, the termination circuit 1110 includes a plurality of termination circuit branches 1111, 1112 and 1113. The termination circuit branch 1111 includes a PMOS transistor MP11 and a resistor R11, which are coupled in series with each other between a line L2 and a power supply voltage VDDQ. The termination circuit branch 1111 includes an NMOS transistor MN11 and a resistor R12, which are coupled in series with each other between the line L2 and a ground VSS. The termination circuit branch 1112 includes a PMOS transistor MP12 and a resistor R13, which are coupled in series with each other between the line L2 and the power supply voltage VDDQ. The termination circuit branch 1112 includes an NMOS transistor MN12 and a resistor R14, which are coupled in series with each other between the line L2 and the ground VSS. The termination circuit branch 1113 includes a PMOS transistor MP13 and a resistor R15, which are coupled in series with each other between the line L2 and the power supply voltage VDDQ. The termination circuit branch 1113 includes an NMOS transistor MN13 and a resistor R16, which are coupled in series with each other between the line L2 and the ground VSS.

Hereinafter, the operation of the ODT circuit 1110 is described.

The line L2 is coupled to the test device 2000 through the pad 1420 in FIG. 2.

When the termination impedance control signals ICONP1 through ICONPn are altogether logic 'high' and the termination impedance control signals ICONN1 through ICONNn are altogether logic 'low', the PMOS transistors MP11, MP12 and MP13 and the NMOS transistors MN11, MN12 and MN13 are altogether turned off. In this case, the resistors R11 through R16 do not affect the line L2 coupled to the pad 1420, that is, the ODT circuit 1110 is disabled.

When the termination impedance control signal ICONP1 is logic 'low' and the termination impedance control signal ICONN1 is logic 'high', the PMOS transistor MP11 and the NMOS transistor MN11 are turned on. Therefore, the termination circuit branch 1111 provides the termination impedance to the line L2. The value of the termination impedance is determined by two resistors R11 and R12.

When the termination impedance control signal ICONP2 is logic 'low' and the termination impedance control signal ICONN2 is logic 'high', the PMOS transistor MP12 and the NMOS transistor MN12 are turned on. Therefore, the termination circuit branch 1112 provides the termination impedance to the line L2. The value of the termination impedance determined by two resistors R13 and R14.

When the termination impedance control signals ICONP1 and ICONP2 are logic 'low' and the termination impedance control signals ICONN1 and ICONN2 are logic 'high', the PMOS transistors MP11 and MP12 and the NMOS transistors MN11 and MN12 are turned on. Therefore, the termination circuit branches 1111 and 1112 provide the termination impedance to the line L2.

As described above, the ODT circuit 1110 generates various termination impedances in response to the termination impedance control signals ICONP1 through ICONPn.

Figure 4:
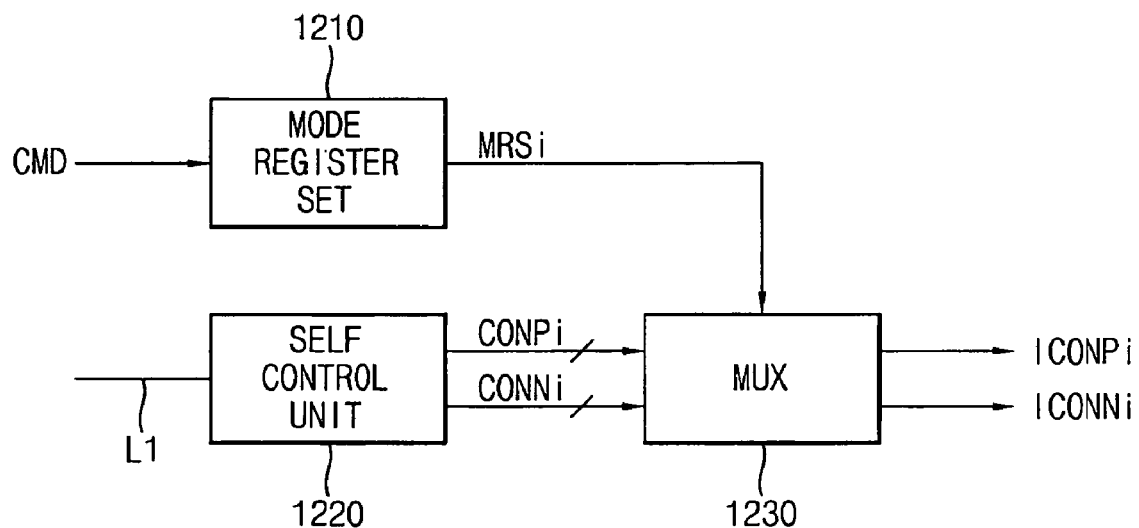
FIG. 4 is a block diagram illustrating an example embodiment of the termination impedance control circuit in the semiconductor memory device in FIG. 2.

FIG. 4 is a block diagram illustrating an example embodiment of the termination impedance control circuit 1200 in the semiconductor memory device in FIG. 2.

Referring to FIG. 4, the termination impedance control circuit 1200 includes a mode register set (MRS) circuit 1210, a self-control unit 1220 and a multiplexer 1230.

The operation of the termination impedance control circuit 1200 is described as follows.

The MRS circuit 1210 generates a MRS signal MRSi in response to the test mode command CMD. The self-control unit 1220 generates a first self-variable control signal CONPi and a second self-variable control signal CONNi for controlling self-termination. The multiplexer 1230 multiplexes the first and the second self-variable control signals CONPi and CONNi to generate termination impedance control signals ICONPi and ICONNi in response to the MRS signal MRSi.

Figure 5:
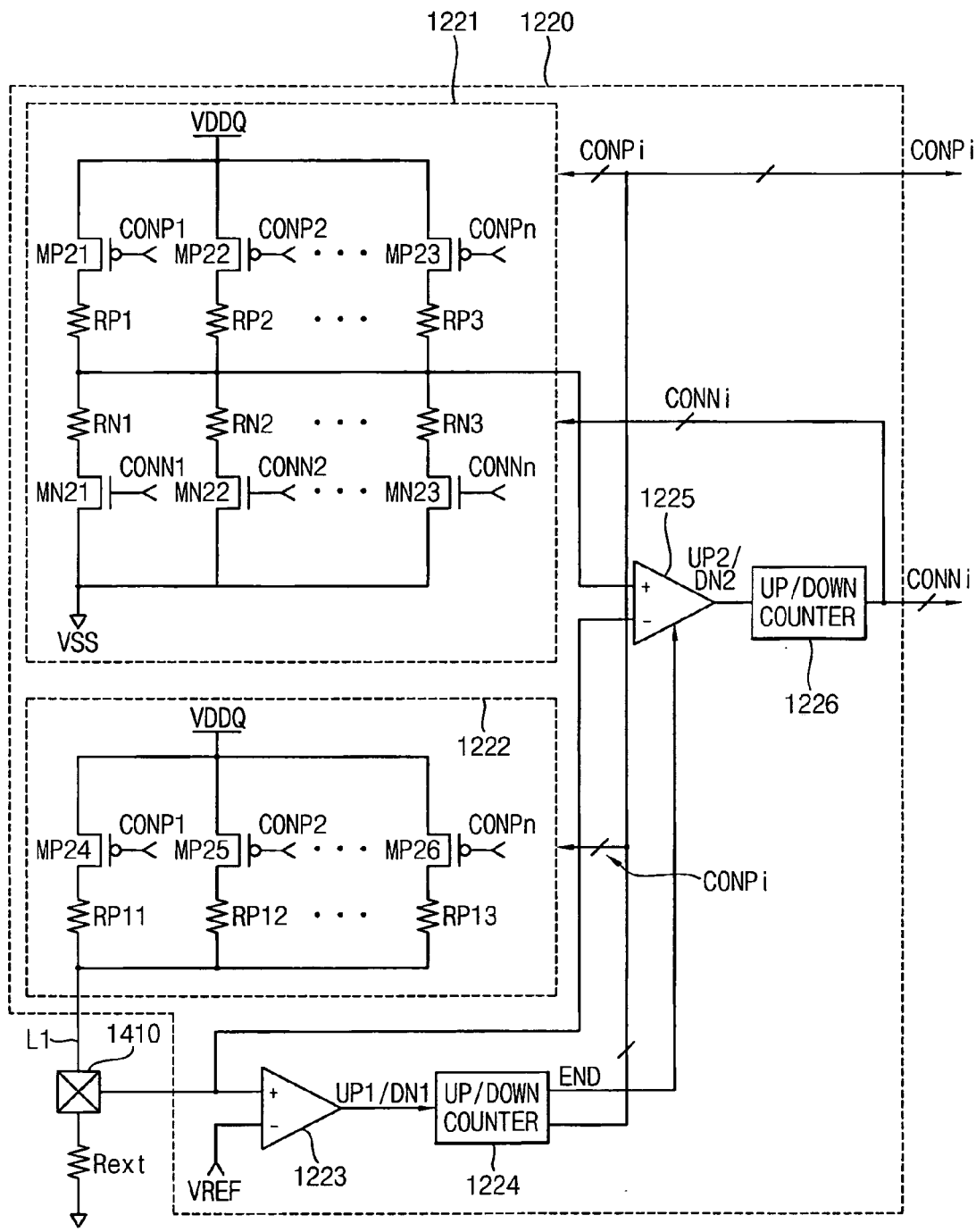
FIG. 5 is a circuit diagram illustrating an example of the self-control unit in the termination impedance control circuit in FIG. 4.

FIG. 5 is a circuit diagram illustrating an example of the self-control unit 1220 in the termination impedance control circuit in FIG. 4.

Referring to FIG. 5, the self-control unit 1220 includes a first self-control circuit 1221, a second self-control circuit 1222, comparators 1223 and 1225, and up/down counters 1224 and 1226.

The operation of the self-control unit 1220 is described as follows.

The impedance of the first self-control circuit 1221 is controlled after the impedance of the second self-control circuit 1222 is adjusted. For example, when an impedance of the second self-control circuit 1222 is controlled for 70Ω with the external resistor Rext of 140Ω, the first comparator 1223 generates a comparison signal UP1/DN1 by comparing a voltage of the pad 1410 with the reference voltage VREF. When the voltage of the pad 1410 corresponds to a value that is generated by a resistance under 70Ω, the first comparator 1223 provides the up signal UP1, which is logic 'low', to the first up/down counter 1224. The first up/down counter 1224 performs up-counting operation in response to the up signal UP1, and generates the first self-variable control signal CONPi for controlling a PMOS transistor array. Accordingly, a selected transistor among the PMOS transistors MP21, MP22, MP23, MP24, MP25 and MP26 in the first and the second self-control circuits 1221 and 1222 is turned on. For example, when the signal CONP1 of the first self-variable signals CONPi is logic 'low', the PMOS transistors MP21 and MP24 are turned on and a resistor RP11 is electrically connected to the power supply voltage VDDQ. When the voltage of the pad 1410 corresponds to resistance of 70Ω, the comparison signal UP1/DN1 oscillates between the up signal UP1 and the down signal DN1 and the first up/down counter 1224 outputs an ending signal END representing that the impedance control of the second self-control circuit 1222 is completed. The second comparator 1225 begins a comparison operation in response to the ending signal END. The second comparator 1225 generates a comparison signal UP2/DN2 by comparing a voltage at a connecting point between a resistor RPi (not shown) and a resistor RNi (not shown) with the voltage of the pad 1410. The second up/down counter 1226 performs an up/down counting operation in response to the comparison signal UP2/DN2, and generates the second self-variable control signal CONNi for controlling an NMOS transistor array. Accordingly, a selected transistor among the NMOS transistors MN21, MN22 and MN23 in the first self-control circuits 1221 is turned on. A composite resistance of resistors connected between the power supply voltage VDDQ and the ground is varied according to the on/-off operation of the MOS transistors in the first and second self-control circuits 1221 and 1222, and thus the impedance, which is controlled according to the power supply voltage and temperature, is varied. The first and the second self-variable control signals CONPi and CONNi are provided to the multiplexer 1230.

Hereinafter, operation of the ODT test system in FIG. 2 will be described with reference to FIGS. 2 through 5.

The boundary scan circuit 1300 (see FIG. 2) may be a circuit coupled to the pads in the semiconductor device to test whether contacts of the pins are defective.

The boundary scan registers 1310, 1320 and 1330, which are included in the boundary scan circuit 1300, have a storing function and a shifting function and form a scan chain. An output BS01 of the boundary scan register 1310 is inputted to the boundary scan register 1320, and an output BS02 of the boundary scan register 1320 is inputted to the next boundary scan register.

When the ODT circuit 1110 coupled to the pads 1420 is selected as a test object by the test device 2000, a value of the termination impedance ODT01 (an output of the ODT circuit 1110) is stored in the boundary scan register 1310. The stored value is outputted through the boundary scan registers 1320 and 1330 by shifting operation. An output BS0$m$ of the boundary scan circuit 1300 is provided to the test device 2000 through the pad 1450. That is, the termination impedance ODT01 (the output of the ODT circuit 1110) is outputted through the pad 1450 and is measured by the test device 2000.

When the ODT circuit 1120 coupled to the pads 1430 is selected as a test object by the test device 2000, a value of the termination impedance ODT02 (an output of the ODT circuit 1120) is stored in the boundary scan register 1320. The stored value is outputted through the boundary scan register 1330 by shifting operation. That is, the termination impedance ODT02 (the output of the ODT circuit 1120) is outputted through the pad 1450 and is measured by the test device 2000.

As described above, one pad 1450 is used by the boundary scan circuit 1300 in the ODT test system in FIG. 2 according to the example embodiments of the present invention so that the termination impedances of the termination circuits 1110, 1120 and 1130, which are coupled to the pads 1420, 1430 and 1440 in the semiconductor memory device 1000, may be measured. Accordingly, the semiconductor memory device 1000 may test whether the termination circuit 1110, 1120 and 1130 are defective or not by using one pin coupled to the pad 1450.

Figure 6:
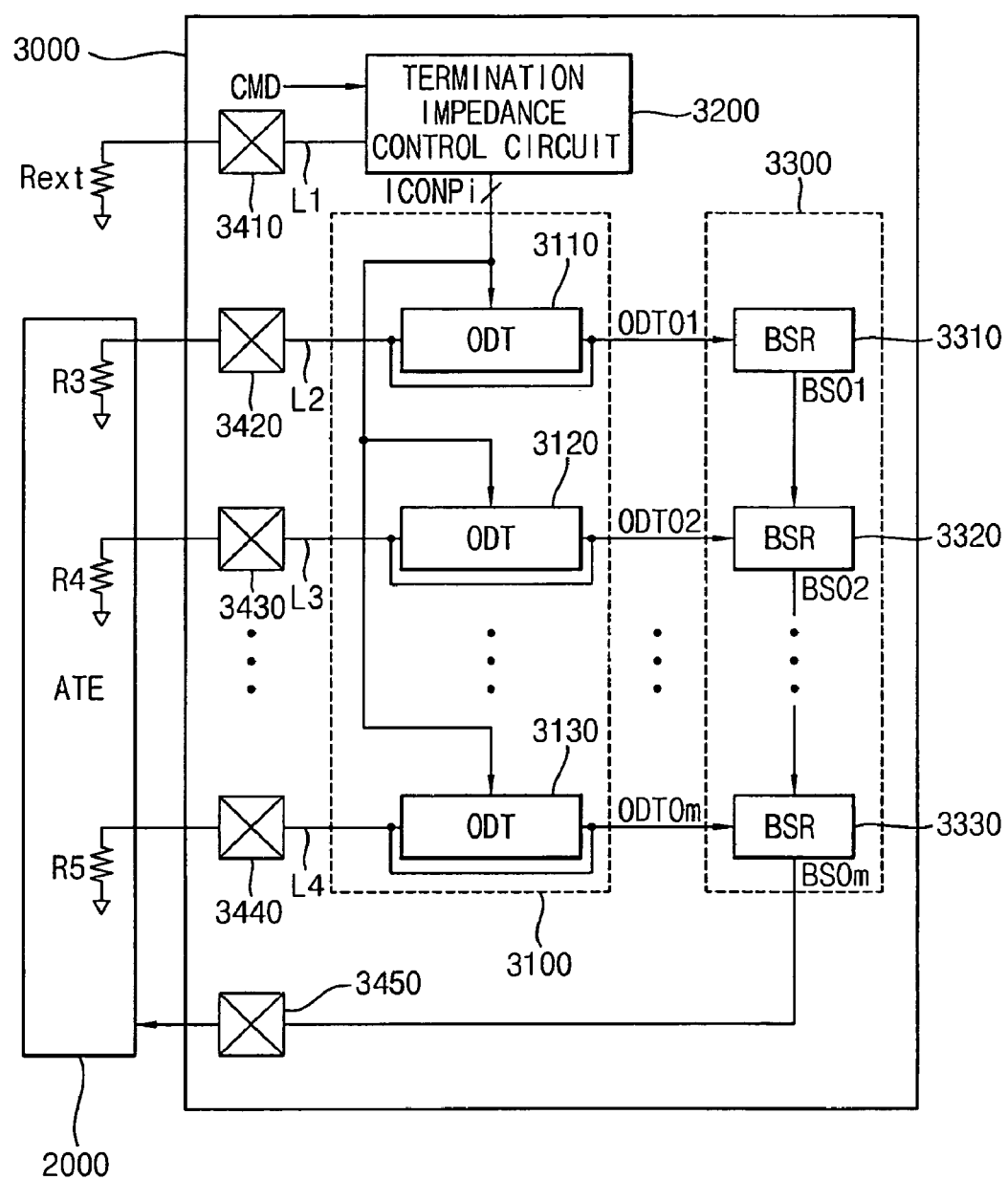
FIG. 6 is a block diagram illustrating an ODT test system including an ODT circuit and a boundary scan circuit according to another example embodiment of the present invention.

FIG. 6 is a block diagram illustrating an on die termination (ODT) test system including a semiconductor device according to another example embodiment of the present invention.

Referring to FIG. 6, the ODT test system includes a semiconductor device 3000 and a test device 2000. The semiconductor device (e.g., a semiconductor memory device) 3000 includes an ODT unit 3100, a termination impedance control circuit 3200, a boundary scan circuit 3300 and pads 3410 through 3450. The test device 2000 includes resistors R3, R4 and R5 coupled to the pads 3420, 3430 and 3440. The ODT unit 3100 includes termination circuits 3110, 3120 and 3130 coupled to the pads 3420, 3430 and 3440. The boundary scan circuit 3300 includes boundary scan registers 3310, 3320 and 3330.

The termination impedance control circuit 3200 may be coupled to an external resistor Rext through the pad 3410. The pads 3410, 3420, 3430, 3440 and 3450 are coupled to Input/Output pins (not shown).

The ODT test system in FIG. 6 has a circuit configuration similar to the ODT test system in FIG. 2. However, unlike the ODT test system in FIG. 2, the ODT test system in FIG. 6 has a different termination impedance control signal for controlling the ODT circuit 3100 in the semiconductor memory device 3000. The ODT circuit 3100 includes PMOS transistors and the termination impedance control signal includes only the termination impedance control signal ICONPi for controlling the PMOS transistors.

The termination impedance control circuit 3200 generates the termination impedance control signal ICONPi in response to a test mode command CMD. The ODT circuit 3200 is coupled to the plurality of input/output pads 3420, 3430 and 3440. The ODT circuit 3200 generates a plurality of termination impedances ODT01 to ODT0m in response to the impedance control signal ICONPi. The boundary scan circuit 3300 stores the termination impedances ODT01 to ODT0m to output the stored termination impedances ODT01 to ODT0m sequentially when the test mode command CMD is enabled. In general, the semiconductor device includes the boundary scan circuit 3300 coupled to the pads in the semiconductor device so as to test whether contacts of the pins are defective.

The test devices 2000 generates the test mode command CMD, which is provided to the semiconductor memory device 3000, and measures the termination impedances ODT01 through ODT0m.

Figure 7:
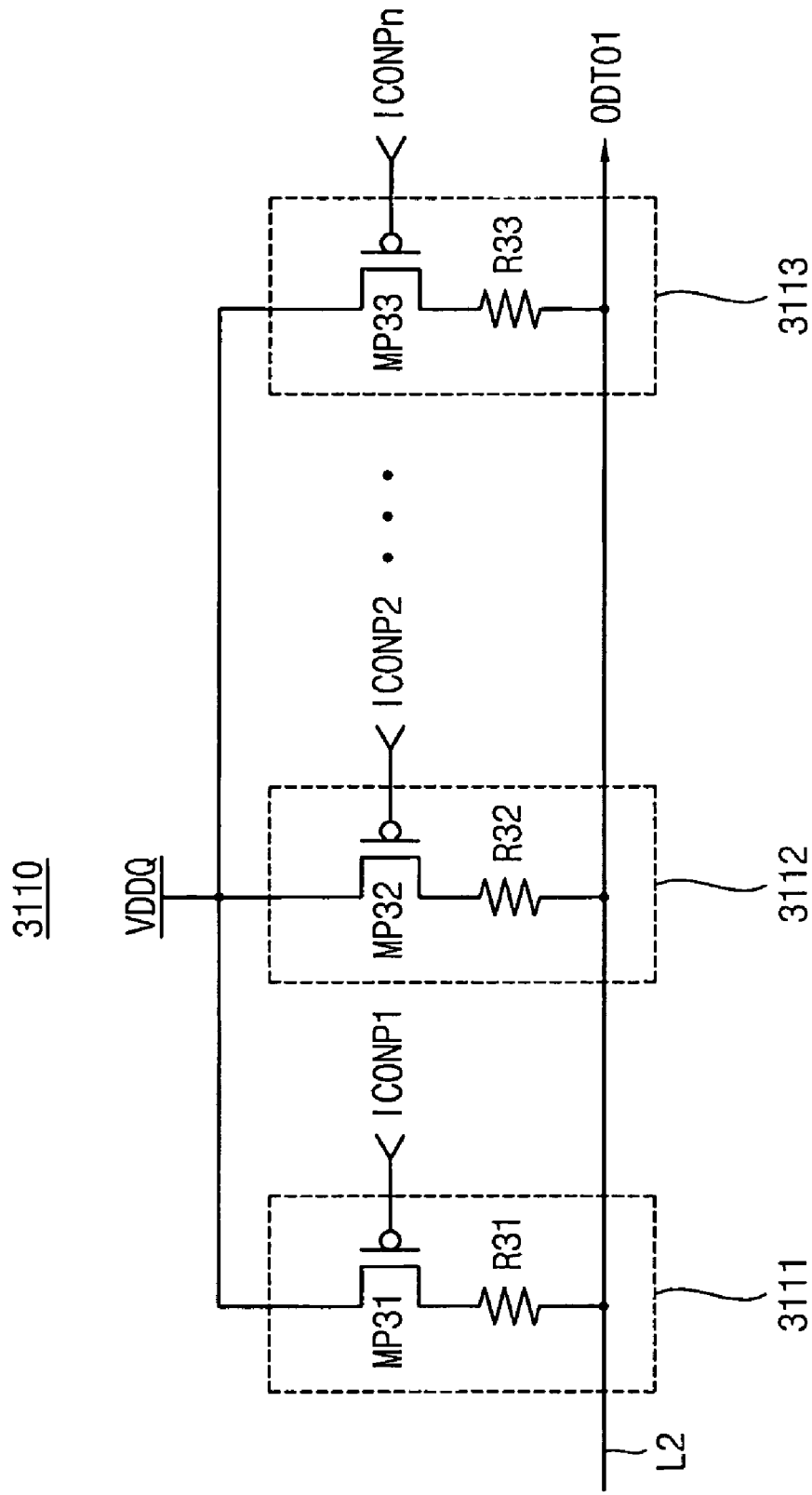
FIG. 7 is a circuit diagram illustrating an example embodiment of the ODT circuit included in the semiconductor memory device in FIG. 6.

FIG. 7 is a circuit diagram illustrating an example embodiment of the ODT circuit included in the semiconductor memory device in FIG. 6.

Referring to FIG. 7, the termination circuit 3110 includes a plurality of termination circuit branches 3111, 3112 and 3113. The termination circuit branch 3111 includes a PMOS transistor MP31 and a resistor R31, which are coupled in series with each other between a line L2 and a power supply voltage VDDQ. The termination circuit branch 3112 includes a PMOS transistor MP32 and a resistor R32, which are coupled in series with each other between the line L2 and the power supply voltage VDDQ. The termination circuit branch 3113 includes a PMOS transistor MP33 and a resistor R33, which are coupled in series with each other between the line L2 and the power supply voltage VDDQ.

The operation of the ODT circuit 3110 is described as follows.

The line L2 is coupled to the test device 2000 through the pad 3420 in FIG. 6.

When the termination impedance control signals ICONP1 to ICONPn are altogether logic 'high', the PMOS transistors MP31, MP32 and MP3 are altogether turned off. In this case, the resistors R31, R32 and R33 do not affect the line L2 coupled to the pad 3420, that is, the ODT circuit 3110 is disabled.

When the termination impedance control signal ICONP1 is logic 'low', the PMOS transistor MP31 is turned on and then the termination circuit branch 3111 provides the termination impedance to the line L2. The value of the termination impedance is determined by the resistor R31.

When the termination impedance control signal ICONP1 is logic 'low', the PMOS transistor MP32 is turned on and then the termination circuit branch 3112 provides the termination impedance to the line L2. The value of the termination impedance is determined by the resistor R32.

When the termination impedance control signals ICONP1 and ICONP2 are logic 'low', the PMOS transistors MP31 and MP32 are turned on and then the termination circuit branches 3111 and 3112 provide the termination impedance to the line L2.

As described above, the ODT circuit 3110 generates various termination impedances in response to the termination impedance control signals ICONP1 to ICONPn.

Figure 8:
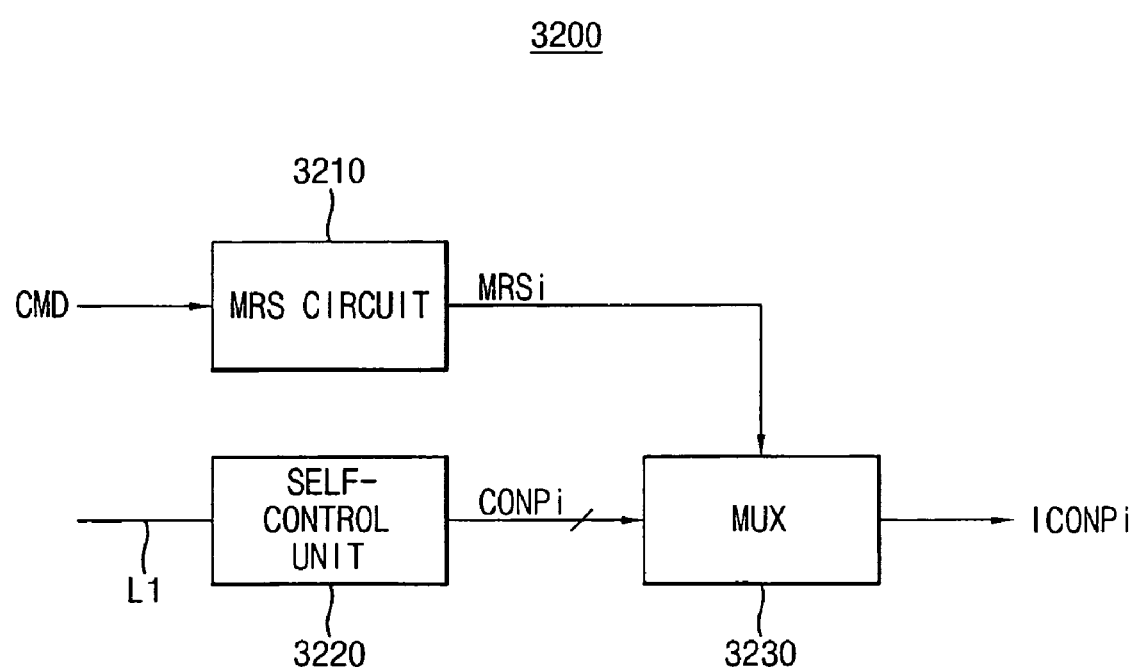
FIG. 8 is a block diagram illustrating an example embodiment of the termination impedance control circuit 3200 in the semiconductor memory device in FIG. 6.

FIG. 8 is a block diagram illustrating an example embodiment of the termination impedance control circuit 3200 in the semiconductor memory device in FIG. 6.

Referring to FIG. 8, the termination impedance control circuit 3200 includes a mode register set (MRS) circuit 3210, a self-control unit 3220 and a multiplexer 3230.

The operation of the termination impedance control circuit 3200 is described as follows.

The MRS circuit 3210 generates a MRS signal MRSi in response to a test mode command CMD. The self-control unit 3220 generates a self-variable control signal CONPi for controlling self-termination. The multiplexer 3230 multiplexes the first self-variable control signals CONPi to generate termination impedance control signals ICONPi in response to the MRS signal MRSi.

Figure 9:
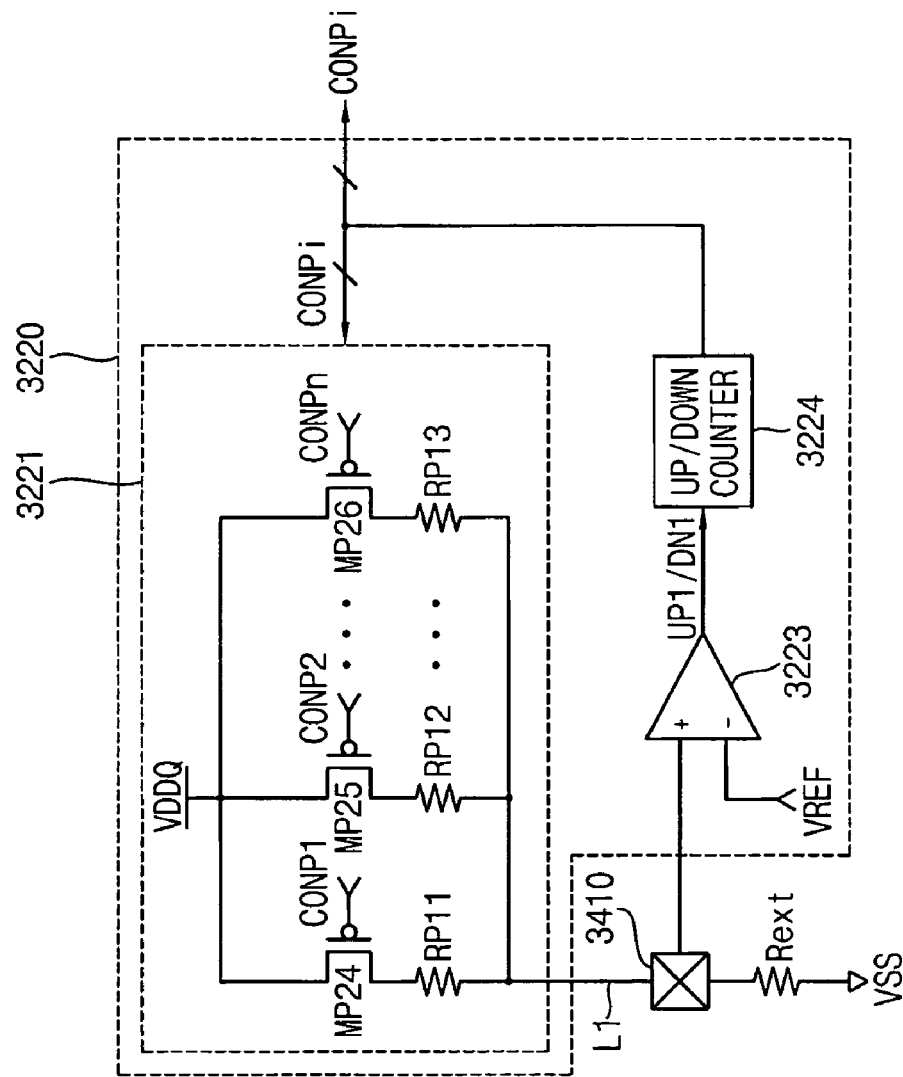
FIG. 9 is a circuit diagram illustrating an example embodiment of the self-control unit 3220 in the termination impedance control circuit in FIG. 8.

FIG. 9 is a circuit diagram illustrating an example embodiment of the self-control unit 3220 in the termination impedance control circuit in FIG. 8.

Referring to FIG. 9, the self-control unit 3220 includes a self-control circuit 3221, a comparator 3223 and an up/down counter 3224.

The operation of the self-control unit 3220 is described as follows.

The self-control circuit 3221 includes PMOS transistors MP24, MP25 and MP26.

For example, when the self-control circuit 3221 is controlled for impedance aiming for 70Ω with the external resistor Rext set to 140Ω, the comparator 3223 generates a comparison signal UP1/DN1 by comparing a voltage of the pad 1410 with the reference voltage VREF. When the voltage of the pad 3410 is generated by a resistance under 70Ω, the comparator 3223 provides the up signal UP1, which is logic 'low', to the up/down counter 3224. The up/down counter 3224 carries out up-counting operation in response to the up signal UP1 and generates the self-variable control signal CONPi for controlling a PMOS transistor array. Accordingly, a selected transistor of the PMOS transistors MP24, MP24 and MP26 in the self-control circuit 3221 is turned on. For example, when the signal CONP1 of the self-variable signals CONPi is logic 'low', the PMOS transistors MP24 is turned on and a resistor RP11 is electrically connected to the power supply voltage VDDQ. When the voltage of the pad 3410 comes to a voltage corresponding to resistance of 70Ω, the comparison signal UP1/DN1 oscillates between the up signal UP1 and the down signal DN1. As varied is a composite resistance of resistors connected between the power supply voltage VDDQ and the ground according to the turn-on/off operation of the MOS transistors in the self-control circuits 3221, varied is the impedance, which is adjusted according to the power supply voltage and temperature. The self-variable control signal CONPi is provided to the multiplexer 3230 (shown in FIG. 8).

Even though semiconductor memory device capable of testing ODT circuits by using a boundary scan circuit has been described with respect to the above embodiments, those skilled in the art will be understood that spirit of the present invention may be applied to other semiconductor devices.

As described above, the semiconductor devices according to some example embodiments of the present invention may test an ODT circuit accurately by using a smaller number of pins and may reduce a required time for testing the semiconductor devices. In addition, the semiconductor devices according to some example embodiments of the present invention may test the ODT circuit by using one pin.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor device comprising:
   a termination impedance control circuit configured to generate a termination impedance control signal in response to a test mode command;

an on die termination (ODT) circuit coupled to a plurality of pads and configured to generate a plurality of termination impedances; and a boundary scan circuit configured to store the termination impedances to sequentially output the stored termination impedances, wherein the termination impedances are sequentially outputted through one pin, wherein the boundary scan circuit includes boundary scan registers cascade-connected with each other, and wherein the boundary scan registers respectively store the termination impedances to sequentially output the termination impedances by a shifting operation.

2. The semiconductor device of claim 1, wherein the termination impedance control signal includes a first termination impedance control signal that controls a P channel transistor array, and a second termination impedance control signal that controls an N channel transistor array.

3. The semiconductor device of claim 2, wherein the ODT circuit comprises a plurality of termination circuits respectively coupled to the pads and configured to generate the plurality of termination impedances.

4. The semiconductor device of claim 3, wherein each of the termination circuits comprises at least one termination circuit branch configured to provide a predetermined impedance to a first node coupled to a corresponding pad in response to the first and second termination impedance control signals.

5. The semiconductor device of claim 4, wherein the termination circuit branch comprises a PMOS transistor, a first resistor, an NMOS transistor and a second resistor, the PMOS transistor and the first resistor being coupled in series between a first power supply voltage and the first node, the NMOS transistor and the second resistor being coupled in series between the first node and a second power supply voltage.

6. The semiconductor device of claim 4, wherein the termination impedance control circuit comprises:
a mode register set (MRS) circuit configured to generate a MRS signal in response to the test command;
a self-control unit configured to generate first and second self-variable control signals for controlling self termination; and
a multiplexer configured to multiplex the first and second self-variable control signals to output the termination impedance control signals in response to the MRS signal.

7. The semiconductor device of claim 6, wherein the self-control unit is coupled to an external resistor outside a semiconductor device.

8. The semiconductor device of claim 1, wherein the termination impedance control signal includes a first termination impedance control signal for controlling a P channel transistor array.

9. The semiconductor device of claim 8, wherein the ODT circuit comprises a plurality of termination circuits respectively coupled to the pads and configured to generate the plurality of termination impedances.

10. The semiconductor device of claim 9, wherein each of the termination circuits comprises at least one termination circuit branch configured to provide a predetermined impedance to a first node in response to the first and second termination impedance control signals, the first node coupled to a corresponding pad.

11. The semiconductor device of claim 10, wherein the termination circuit branch comprises a PMOS transistor and a resistor that are coupled in series between a first power supply voltage and the first node.

12. The semiconductor device of claim 10, wherein the termination impedance control circuit comprises:
a mode register set (MRS) circuit configured to generate a MRS signal in response to the test command;
a self-control unit configured to generate a first self-variable control signal for controlling self termination; and
a multiplexer configured to multiplex the first self-variable control signal to output the termination impedance control signals in response to the MRS signal.

13. The semiconductor device of claim 12, wherein the self-control unit is coupled to an external resistor outside the semiconductor device.

14. A test system comprising:
a termination impedance control circuit configured to generate a termination impedance control signal in response to a test mode command;
an on die termination (ODT) circuit coupled to a plurality of pads and configured to generate a plurality of termination impedances in response to the termination impedance control signal;
a semiconductor memory device that includes a boundary scan circuit configured to store the termination impedances to sequentially output the stored termination impedances; and
a test device configured to generate the test mode command to be provided to the semiconductor memory device and configured to measure the termination impedances,
wherein the termination impedances are sequentially outputted through one pin,
wherein the boundary scan circuit includes boundary scan registers cascade-connected with each other, and
wherein the boundary scan registers respectively store the termination impedances to sequentially output the termination impedances by a shifting operation.

15. The test system of claim 14, wherein the termination impedance control signal includes a first termination impedance control signal that controls a P channel transistor array and a second termination impedance control signal that controls an N channel transistor array.

16. The test system of claim 14, wherein the termination impedance control signal includes a first termination impedance control signal that controls a P channel transistor array.

17. A method of testing on die termination (ODT) circuit, the method comprising:
generating a test mode command;
generating a termination impedance control signal in response to the test mode command;
generating a plurality of termination impedances in response to the termination impedance control signal;
storing the termination impedances to output the stored termination impedances by using a boundary scan circuit; and
measuring the termination impedances,
wherein the termination impedances are sequentially outputted through one pin,
wherein the boundary scan circuit includes boundary scan registers cascade-connected with each other, and
wherein the boundary scan registers respectively store the termination impedances to sequentially output the termination impedances by a shifting operation.

18. The method of claim 17, further comprising setting a first terminal of a resistor to logic 'low', the resistor being coupled to a pad of a semiconductor device.

* * * * *

UNITED STATES PATENT AND TRADEMARK OFFICE
CERTIFICATE OF CORRECTION

| | | |
|---|---|---|
| PATENT NO. | : 7,612,578 B2 | Page 1 of 1 |
| APPLICATION NO. | : 11/585615 | |
| DATED | : November 3, 2009 | |
| INVENTOR(S) | : Chang et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 5 days.

Signed and Sealed this

Nineteenth Day of October, 2010

David J. Kappos
*Director of the United States Patent and Trademark Office*